US007719006B2

(12) United States Patent
Watanabe et al.

(10) Patent No.: US 7,719,006 B2
(45) Date of Patent: May 18, 2010

(54) PHYSICAL QUANTITY SENSOR AND SEMICONDUCTOR DEVICE HAVING PACKAGE AND COVER

(75) Inventors: Tatsuya Watanabe, Anjo (JP); Masahiko Imoto, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/072,319

(22) Filed: Feb. 26, 2008

(65) Prior Publication Data

US 2008/0224304 A1 Sep. 18, 2008

(30) Foreign Application Priority Data

Mar. 12, 2007 (JP) ............................. 2007-062166

(51) Int. Cl.
*H01L 23/58* (2006.01)
(52) U.S. Cl. .................. 257/48; 257/701; 257/704; 257/729; 257/E21.521
(58) Field of Classification Search ................ 257/703, 257/704, 48, 701, 729
See application file for complete search history.

(56) References Cited

U.S. PATENT DOCUMENTS 5,750,926 A * 5/1998 Schulman et al. ........... 174/564
6,615,669 B1 9/2003 Nishimura et al.
6,906,412 B2 6/2005 Furukubo et al.
2004/0055387 A1* 3/2004 Miyazaki et al. .............. 73/754
2005/0275086 A1* 12/2005 Patel et al. .................. 257/706

FOREIGN PATENT DOCUMENTS

| JP | 63-157946 | 10/1988 |
|---|---|---|
| JP | 7-22549 | 4/1995 |
| JP | 8-064709 | 3/1996 |
| JP | 2003-254988 | 9/2003 |
| JP | 2004-003886 | 1/2004 |
| JP | 2006-128183 | 5/2006 |
| JP | 2006-332599 | 12/2006 |

OTHER PUBLICATIONS

Office action dated Dec. 5, 2008 in German Application No. 10 2008 010532.5.
Office action dated Mar. 5, 2009 in Japanese Application No. 2007-062166.
Office action dated Jun. 18, 2009 in Japanese Application No. 2007-062166.

* cited by examiner

*Primary Examiner*—Wai-Sing Louie
(74) *Attorney, Agent, or Firm*—Harness, Dickey & Pierce, PLC

(57) ABSTRACT

A semiconductor device includes: a semiconductor chip; a package for accommodating the chip, wherein the package has a box shape with an opening and a bottom; and a cover for sealing the opening of the package. The semiconductor chip is disposed on the bottom of the package. The cover has a plate shape. The cover includes a protrusion, which is disposed at a center of the plate shape. The protrusion protrudes toward an outside of the package.

7 Claims, 8 Drawing Sheets

FRONT ←→ BACK

PHYSICAL QUANTITY SENSOR AND SEMICONDUCTOR DEVICE HAVING PACKAGE AND COVER

CROSS REFERENCE TO RELATED APPLICATION

This application is based on Japanese Patent Application No. 2007-62166 filed on Mar. 12, 2007, the disclosure of which is incorporated herein by reference.

FIELD OF THE INVENTION

The present invention relates to a physical quantity sensor and a semiconductor device having a package and a cover.

BACKGROUND OF THE INVENTION

A semiconductor device as a sensor includes a case and a cover, which is disclosed in U.S. Pat. No. 6,906,412 corresponding to JP-A-2004-3886. The case accommodates a semiconductor chip, and the cover seals an opening of the case. Specifically, the sensor includes the semiconductor sensor chip, a package as the case and a lid as the cover. The package has a rectangular box shape, and the lid has a rectangular plate shape. The sensor chip is mounted on an inner bottom of the package. A terminal base is formed on the inner bottom of the package, and a bonding pad is formed on the terminal base. The sensor chip is connected to the bonding pad through a bonding wire. The opening of the package is covered and sealed with the lid.

The above sensor is integrally molded together with other electric elements for providing a circuit for the sensor. However, since the lid has the rectangular plate shape, the lid may be deformed toward the package side by pressure in a molding process. When the lid is made of metal, the lid may contact the semiconductor chip or the bonding wire so that the deformation causes to short-circuit the chip.

When the lid is made of material other than metal, for example, when the lid is made of resin, the deformation may cause to generate stress in the bonding wire or the semiconductor chip. When the thickness of the lid becomes larger, the manufacturing cost of the sensor increases. Further, in case of thick lid, when the lid is fixed by a welding method, the welding becomes difficult because the thick lid radiates heat largely.

Thus, it is required for the sensor to improve pressure resistance of the lid.

SUMMARY OF THE INVENTION

In view of the above-described problem, it is an object of the present disclosure to provide a physical quantity sensor. It is another object of the present disclosure to provide a semiconductor device having a package and a cover.

According to a first aspect of the present disclosure, a physical quantity sensor includes: a case made of resin; a connector terminal molded in the case; and a sensing element molded in the case. The sensing element is electrically coupled with the connector terminal. The sensing element includes: a semiconductor chip; a package for accommodating the chip, wherein the package has a box shape with an opening and a bottom; and a cover for sealing the opening of the package. The semiconductor chip is disposed on the bottom of the package. The cover has a plate shape. The cover includes a protrusion, which is disposed at a center of the plate shape, and the protrusion protrudes toward an outside of the package.

In the above sensor, the mechanical strength of the cover is improved, so that the pressure resistance of the sensing element increases. Further, the deformation of the cover is reduced. Furthermore, the distance between the semiconductor chip and a bonding wire or the like is sufficiently secured, so that short-circuit of the sensing element is prevented.

According to a second aspect of the present disclosure, a semiconductor device includes: a semiconductor chip; a package for accommodating the chip, wherein the package has a box shape with an opening and a bottom; and a cover for sealing the opening of the package. The semiconductor chip is disposed on the bottom of the package. The cover has a plate shape. The cover includes a protrusion, which is disposed at a center of the plate shape, and the protrusion protrudes toward an outside of the package.

In the above device, the mechanical strength of the cover is improved, so that the pressure resistance of the semiconductor chip increases. Further, the deformation of the cover is reduced. Furthermore, the distance between the semiconductor chip and a bonding wire or the like is sufficiently secured, so that short-circuit of the semiconductor chip is prevented.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventors have studied about a semiconductor device having a case and a cover. Specifically, when a center of the cover protrudes toward an outside of the case, pressure resistance increases without thickening the thickness of the cover.

First Embodiment

Figure 1:
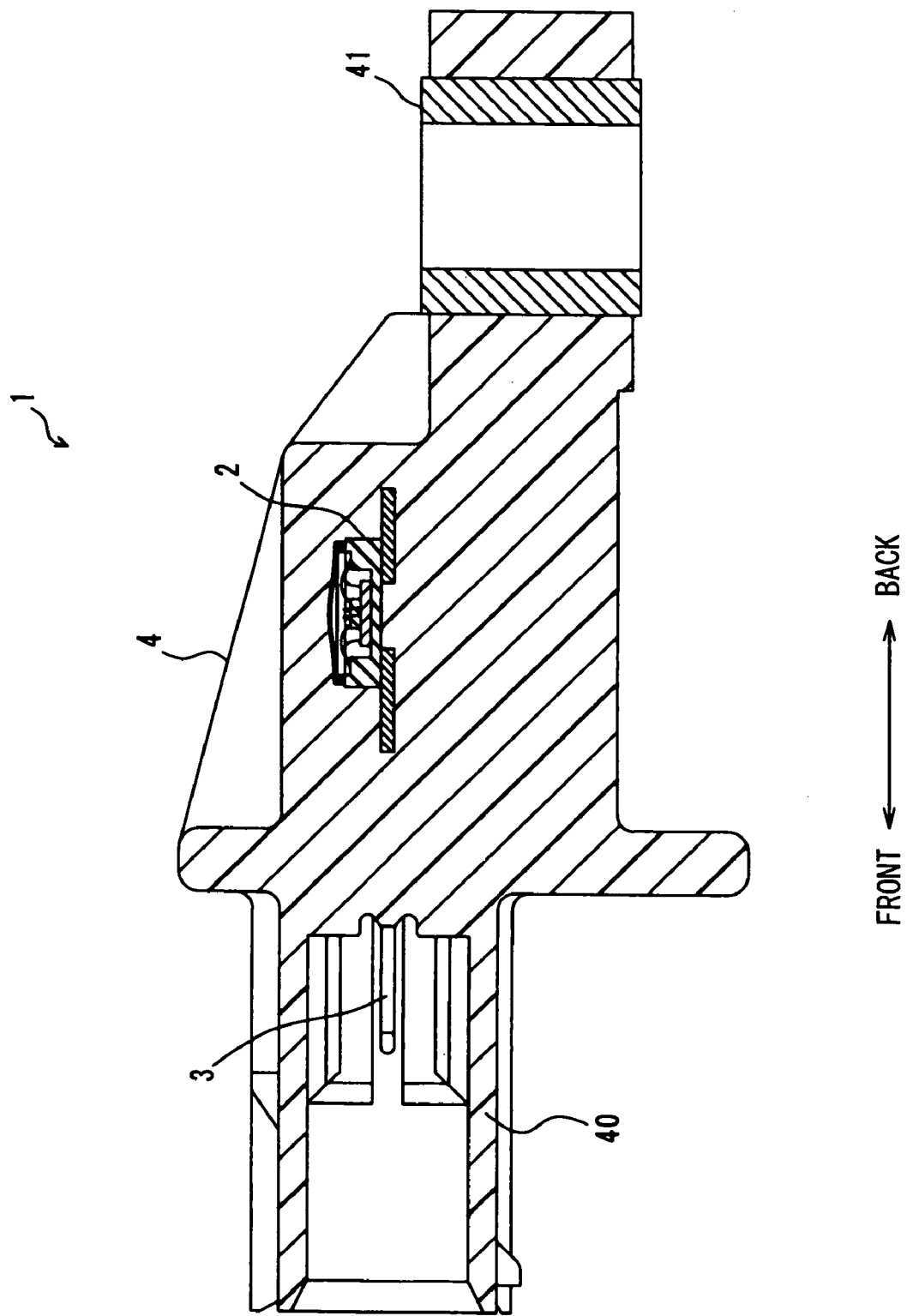
FIG. 1 is a cross sectional view showing an acceleration sensor according to a first embodiment.

FIG. 1 shows an acceleration sensor 1 as a semiconductor device for detecting acceleration, converting the detected acceleration to a signal and outputting the signal.

The acceleration sensor 1 includes an acceleration sensing element 2, an electronic element such as a capacitor (not shown), multiple connector terminals 3 and a case 4. The sensing element 2 and the electronic element are connected to the connector terminal 3. The case 4 made of resin mold integrally seals the sensing element 2 and the electronic element. One end of the connector terminal 3 protrudes from a front of the case 4. Further, a connector housing 40 is integrally formed around the one end of the connector terminal 3 such that the connector housing 40 surrounds the one end of the connector terminal 3. A bushing 41 is integrally formed on a back of the case 4. The sensor 1 is mounted on another equipment with the bushing 41.

Figure 2:
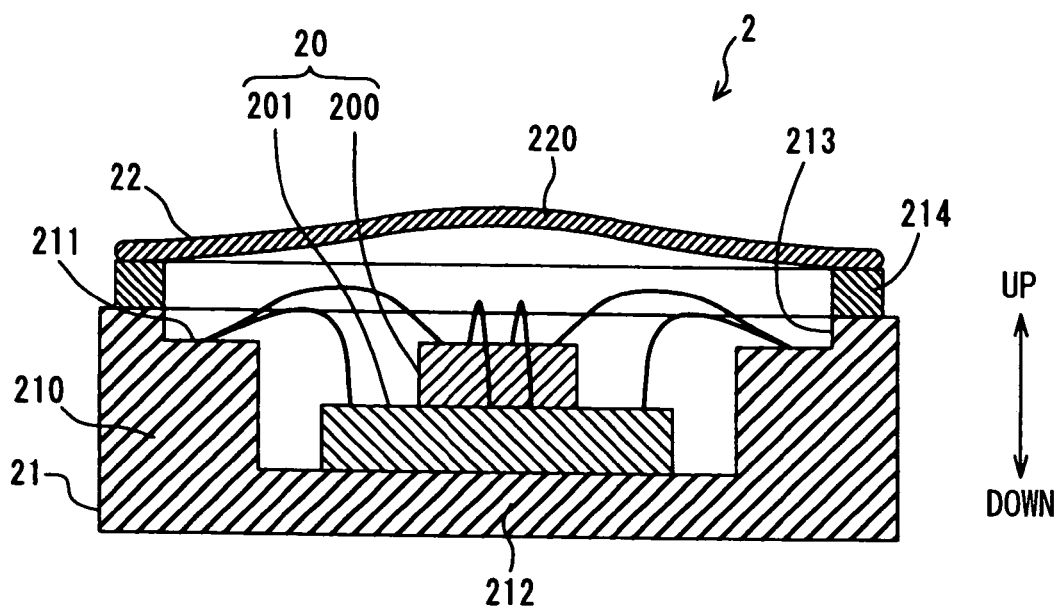
FIG. 2 is a cross sectional view showing a sensing element in the sensor.
Figure 3:
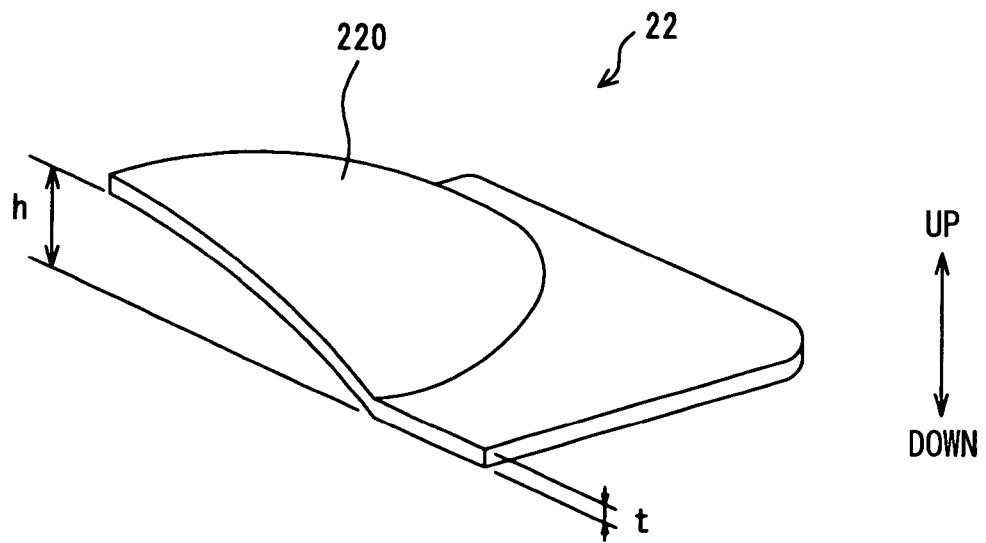
FIG. 3 is a partial perspective view showing a lid in the sensor.

FIGS. 2 and 3 show the sensing element 2. Specifically, FIG. 3 shows a one-fourth part of a lid 22 in the sensing element 2. The sensing element 2 includes a semiconductor sensor chip 20 as a semiconductor chip, a ceramic package 21 as a case and the lid as a cover.

The semiconductor sensor chip 20 is a semiconductor integrated circuit that detects acceleration, covert the detected acceleration to a signal and output the signal. The chip 20 includes an acceleration detection portion 200 and a converting circuit 201. The acceleration detection portion 200 detects the acceleration, which is applied to the sensing element 2. The converting circuit 201 converts the detected acceleration to the signal and outputs the signal. The acceleration detection portion 200 is disposed over and mounted on the converting circuit 201. The acceleration detection portion 200 is electrically coupled with the converting circuit through a bonding wire or a lead.

The ceramic package 21 has a square cylindrical shape with a bottom 212. The ceramic package 21 is made of ceramic, and accommodates the chip 20. The package 21 has a sidewall 210 with a stage 211, which is disposed inside of the package 21. A bonding pad is formed on the stage 211. The package 21 has the bottom 212, on which the chip 20 is mounted. The chip 20 is electrically connected to the bonding pad through a bonding wire or a lead. A seal ring 214 is bonded to a top of the package 21 by a brazing method, the top which is disposed on an opening side of the package 21. The package 21 has an opening 213.

The lid 22 has a square plate shape, and made of metal. The lid 22 seals, i.e., covers the opening 213 of the package 21 so that the chip 20 is accommodated in the package 21. The outline of the lid 22 is larger than the opening 213 of the package 21. The lid 22 includes a protrusion 220, which is disposed at a center of the lid 22. The protrusion has a dome shape protruding toward the outside of the package 21 and having a predetermined curvature. Specifically, as shown in FIG. 3, the outline of the protrusion 22 is a circular shape so that the protrusion is a circular domed shape. The height h of the protrusion 220 and the thickness t of the lid 22 are defined as shown in FIG. 3. The height h is almost equal to the thickness t. In FIG. 3, the height h is overdrawn with respect to the thickness t. The periphery of the lid 22 is seal welded on the seal ring 214. Thus, the lid 22 seals the opening 213 of the package 21.

Figure 4:
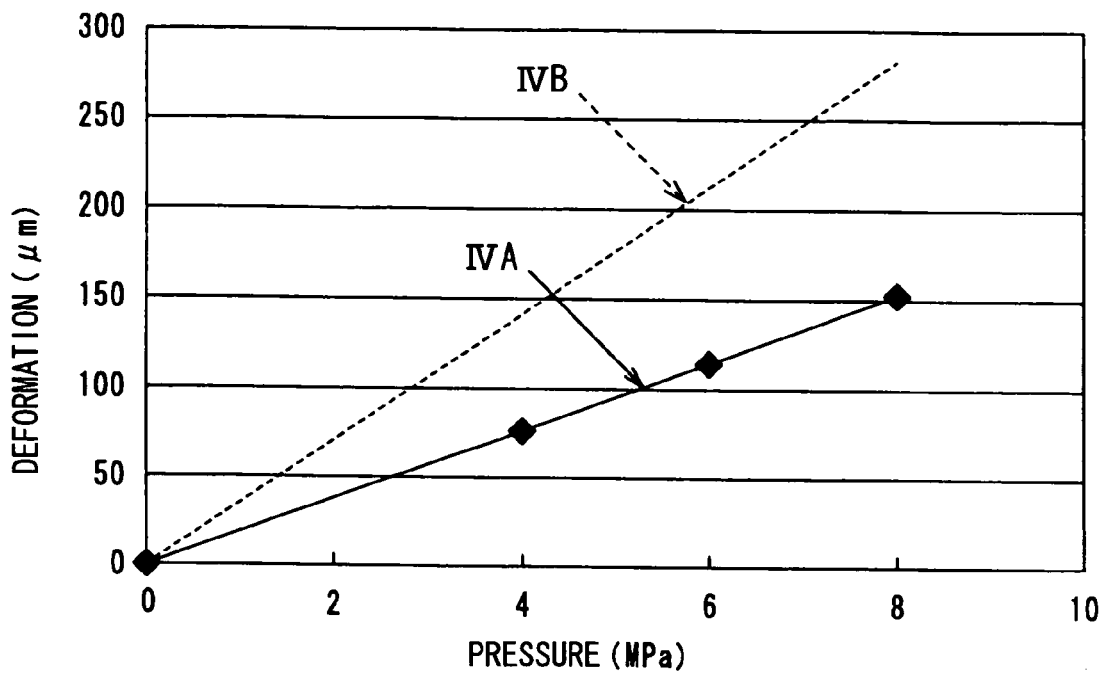
FIG. 4 is a graph showing a relationship between pressure and deformation of the lid in a first example case of the sensor.
Figure 5:
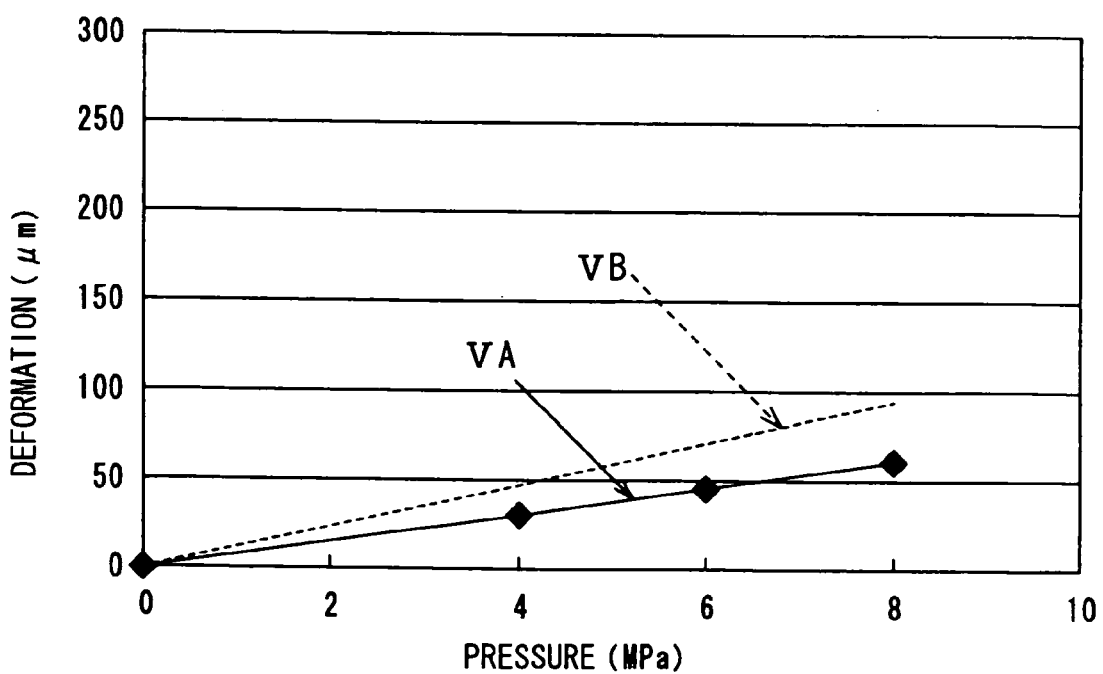
FIG. 5 is a graph showing a relationship between pressure and deformation of the lid in a second example case of the sensor.
Figure 6:
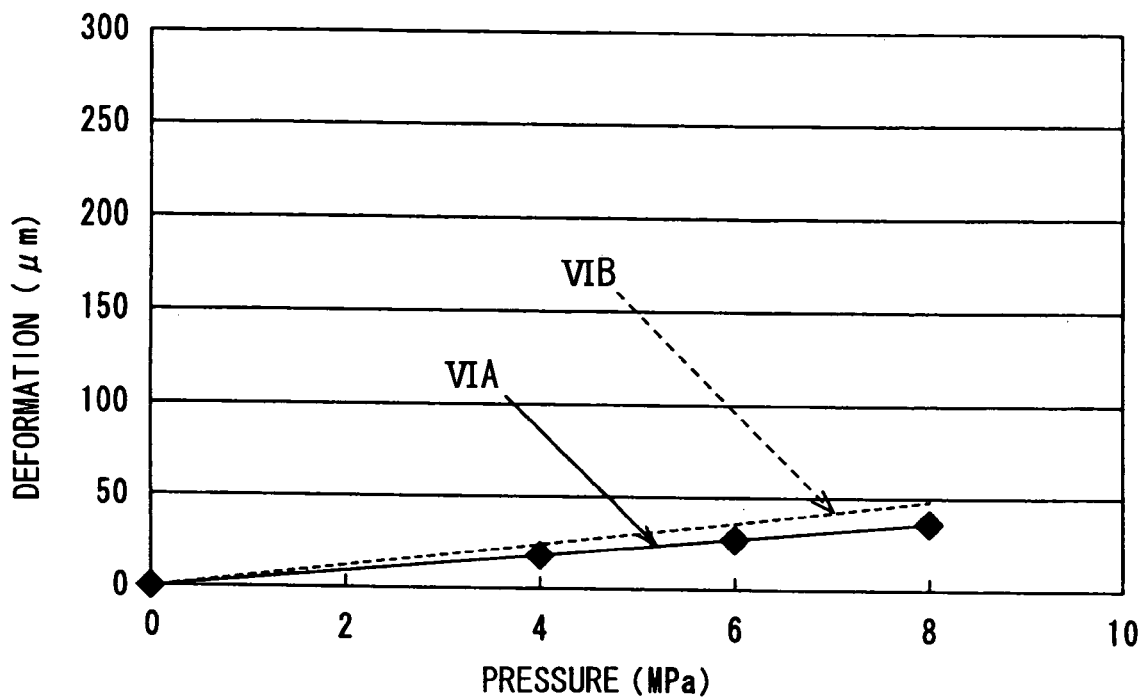
FIG. 6 is a graph showing a relationship between pressure and deformation of the lid in a third example case of the sensor.

FIGS. 4 to 6 shows effects of the lid 22 having the dome shape. FIGS. 4 to 6 are graphs showing analysis results of deformation amount of the lid 22 when external pressure is applied to the lid 22. In FIG. 4, IVA shows a case where the lid 22 has the dome shape with the thickness of 0.1 mm and the height of the protrusion 220 of 0.1 mm. IVB shows a case as a comparison where a lid has a plate shape without a dome, and the thickness of the lid is 0.1 mm. In FIG. 5, VA shows a case where the lid 22 has the dome shape with the thickness of 0.1 mm and the height of the protrusion 220 of 0.25 mm. VB shows a case as a comparison where a lid has a plate shape without a dome, and the thickness of the lid is 0.15 mm. In FIG. 6, VIA shows a case where the lid 22 has the dome shape with the thickness of 0.1 mm and the height of the protrusion 220 of 0.5 mm. VIB shows a case as a comparison where a lid has a plate shape without a dome, and the thickness of the lid is 0.2 mm.

When the sensing element 2 is molded with the case 4, molding pressure is applied to the sensing element 2. However, the protrusion 220 is disposed at the center of the lid 22. Further, the height h of the protrusion 220 is set to be equal to the thickness t of the lid 22. Specifically, in this case, as shown in FIG. 4, the deformation amount of the lid 22 with respect to the pressure in the curve IVA is about 60% of that in the curve IVB. Accordingly, without increasing the thickness of the lid 22, the pressure resistance of the sensing element 2 is improved. Thus, when the case 4 molds the sensing element 2, the deformation of the lid 22 caused by the molding pressure is reduced. Further, since the protrusion 220 of the lid 22 protrudes toward the outside of the semiconductor sensor chip 20, even when the lid 22 is deformed toward the sensor chip 20, a distance between the chip 20 and a bonding wire or a lead is sufficiently maintained. Thus, short-circuit of the chip 20 is prevented from occurring.

When the thickness t of the lid 22 is 0.1 mm, and the height h of the protrusion 220 is 0.25 mm, as shown in FIG. 5, the deformation amount of the lid 22 in the curve VA becomes smaller than that in the curve VB, which represents that the thickness is 0.15 mm, and the lid has the plate shape without a dome. When the thickness t of the lid 22 is 0.1 mm, and the height h of the protrusion 220 is 0.5 mm, as shown in FIG. 6, the deformation amount of the lid 22 in the curve VIA becomes smaller than that in the curve VIB, which represents that the thickness is 0.2 mm, and the lid has the plate shape without a dome.

Second Embodiment

Figure 7:
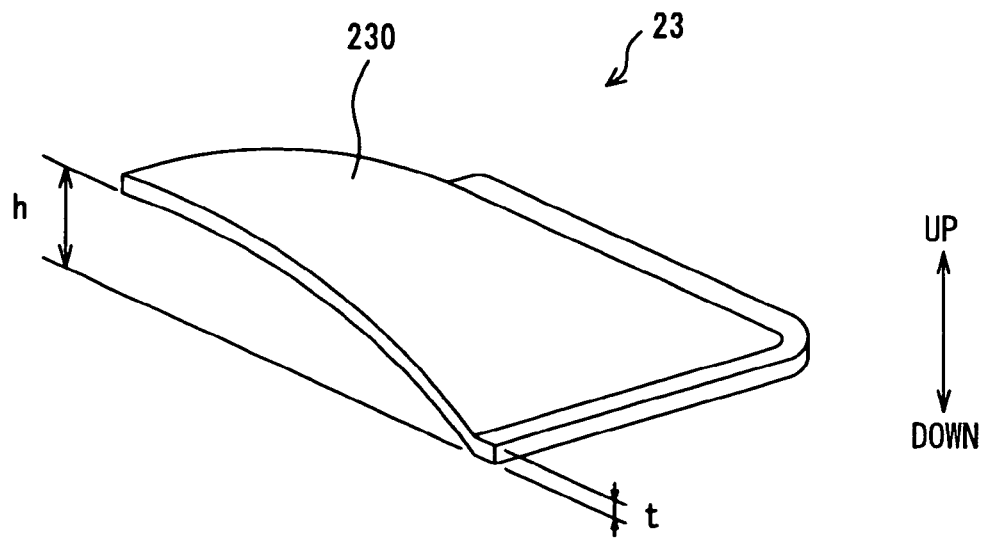
FIG. 7 is a partial perspective view showing a lid in an acceleration sensor according to a second embodiment.

FIG. 7 shows a lid 23 according to a second embodiment. The lid 23 has a protrusion 230, which is disposed at a center of the lid 23. The protrusion 230 protrudes toward the outside of the package 21, and has a curved dome shape. Specifically, the protrusion 230 has a square domed shape.

Figure 8:
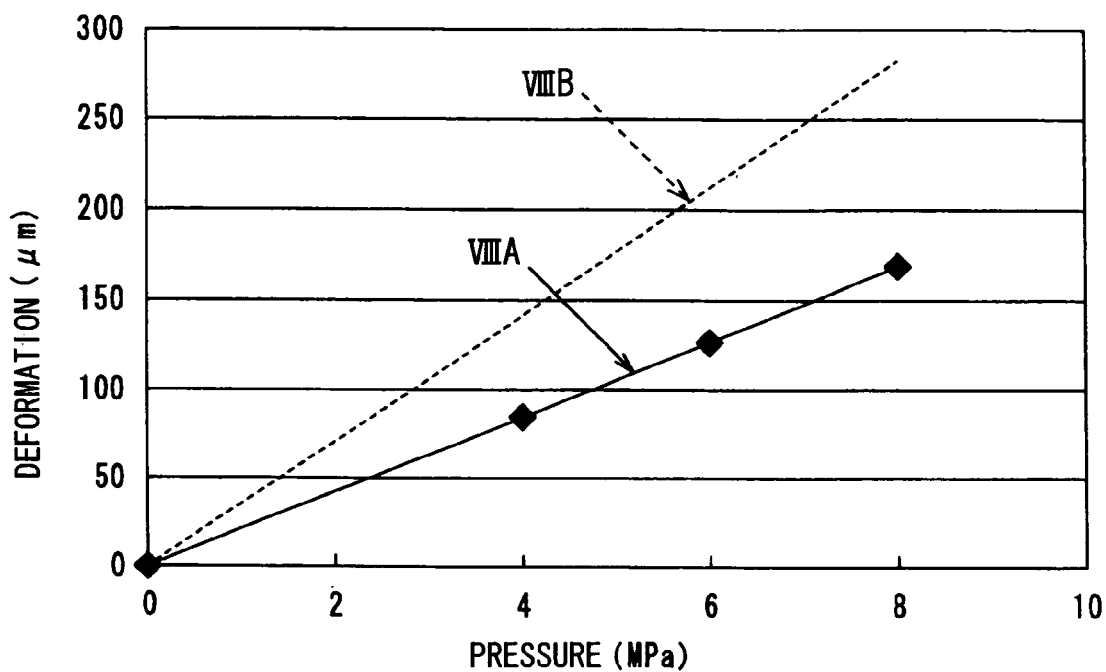
FIG. 8 is a graph showing a relationship between pressure and deformation of the lid in a fourth example case of the sensor.
Figure 9:
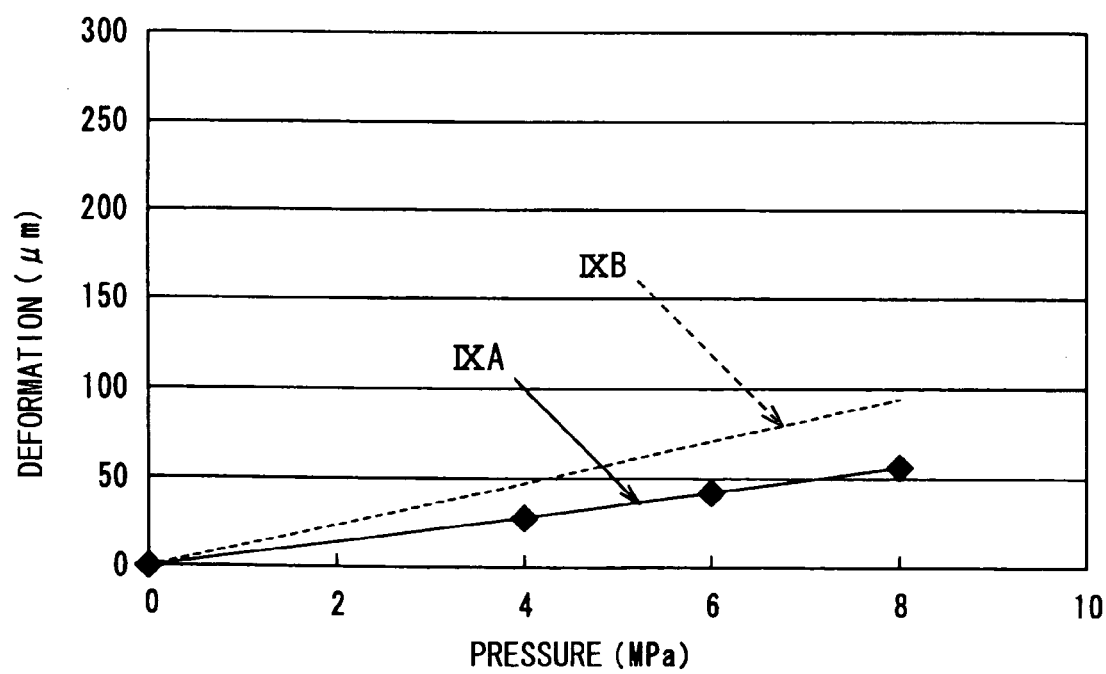
FIG. 9 is a graph showing a relationship between pressure and deformation of the lid in a fifth example case of the sensor.
Figure 10:
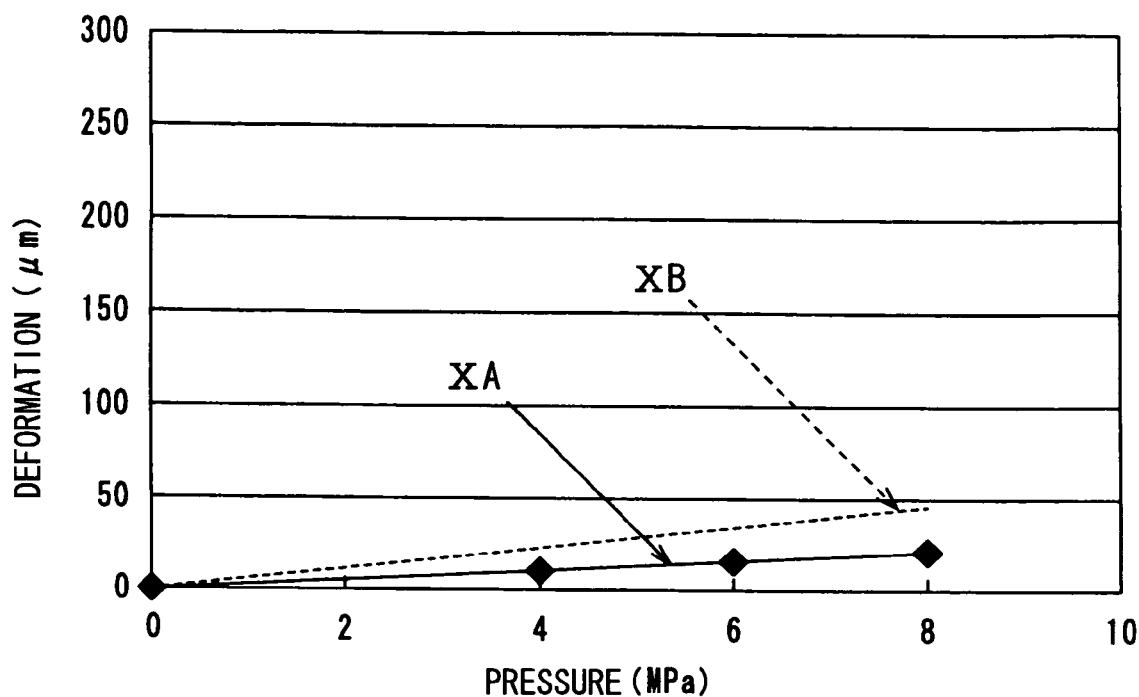
FIG. 10 is a graph showing a relationship between pressure and deformation of the lid in a sixth example case of the sensor.

FIGS. 8 to 10 shows effects of the lid 23 having the dome shape. FIGS. 8 to 10 are graphs showing analysis results of deformation amount of the lid 23 when external pressure is applied to the lid 23. In FIG. 8, VIIIA shows a case where the lid 23 has the dome shape with the thickness of 0.1 mm and the height of the protrusion 230 of 0.1 mm. VIIIB shows a case as a comparison where a lid has a plate shape without a dome, and the thickness of the lid is 0.1 mm. In FIG. 9, IXA shows a case where the lid 23 has the dome shape with the thickness of 0.1 mm and the height of the protrusion 230 of 0.25 mm. IXB shows a case as a comparison where a lid has a plate shape without a dome, and the thickness of the lid is 0.15 mm. In FIG. 10, XA shows a case where the lid 23 has the dome shape with the thickness of 0.1 mm and the height of the protrusion 230 of 0.5 mm. XB shows a case as a comparison where a lid has a plate shape without a dome, and the thickness of the lid is 0.2 mm.

In a case where the thickness of the lid 23 is 0.1 mm, and the height of the protrusion 230 is 0.1 mm, as shown in FIG. 8, the deformation amount of the lid 23 with respect to the pressure in the curve VIIIA is about 60% of that in the curve VIIIB. When the thickness t of the lid 23 is 0.1 mm, and the height h of the protrusion 230 is 0.25 mm, as shown in FIG. 9, the deformation amount of the lid 23 in the curve IXA becomes smaller than that in the curve IXB, which represents that the thickness is 0.15 mm, and the lid has the plate shape. When the thickness t of the lid 23 is 0.1 mm, and the height h of the protrusion 230 is 0.5 mm, as shown in FIG. 10, the deformation amount of the lid 23 in the curve XA becomes smaller than that in the curve XB, which represents that the thickness is 0.2 mm, and the lid has the plate shape.

Accordingly, without increasing the thickness of the lid 23, the pressure resistance of the sensing element 2 is improved. Further, short-circuit of the chip 20 is prevented from occurring.

Third Embodiment

Figure 11:
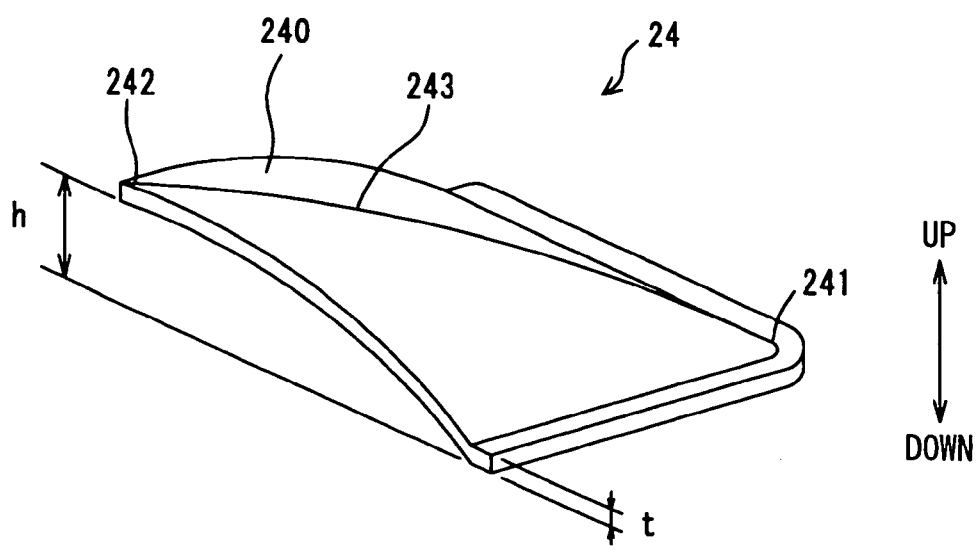
FIG. 11 is a partial perspective view showing a lid in an acceleration sensor according to a third embodiment.

FIG. 11 shows a lid 24 according to a third embodiment. The lid 24 has a protrusion 240, which is disposed at a center of the lid 24. The protrusion 240 protrudes toward the outside of the package 21, and has a curved dome shape. Specifically, the protrusion 240 has a square domed shape. Further, the outline of the protrusion 240 is a square with four corners 241. The dome shape has a top 242. An edge 243 is formed on the dome shape from the top 242 to each corner 241. Thus, the edge 243 is formed along with a diagonal line of the square domed shape.

Figure 12:
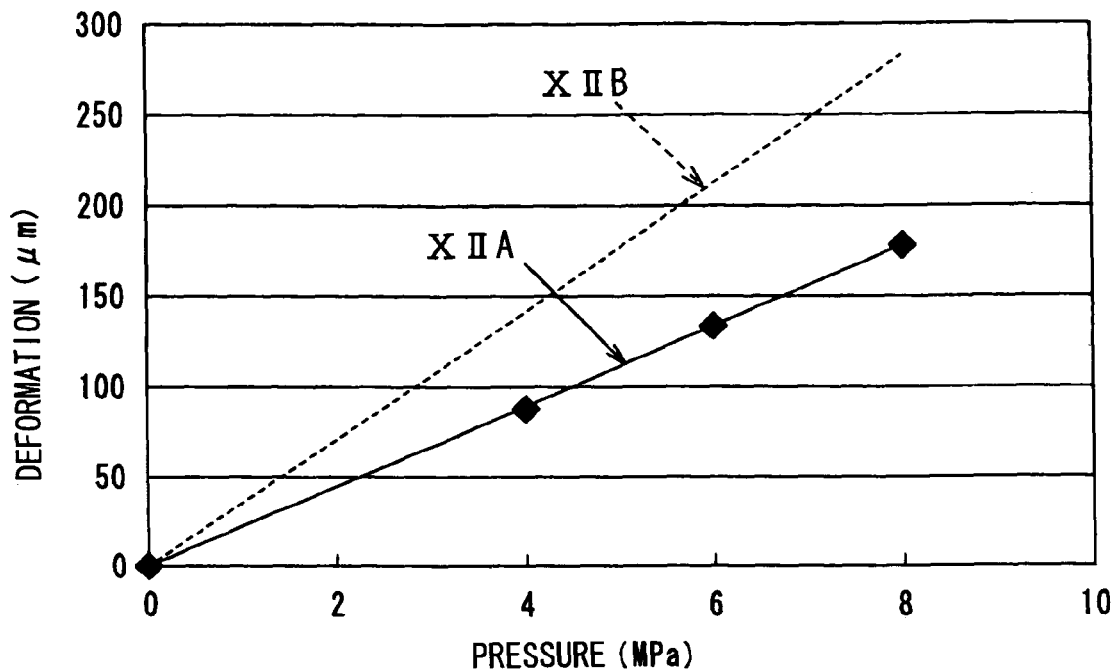
FIG. 12 is a graph showing a relationship between pressure and deformation of the lid in a seventh example case of the sensor.
Figure 13:
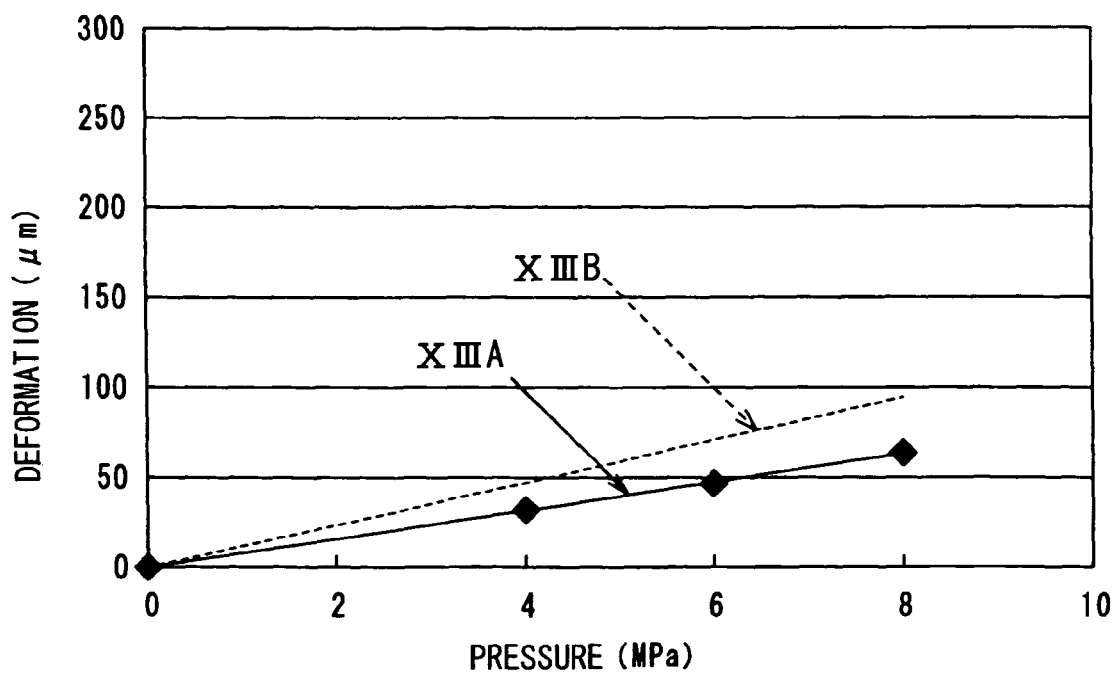
FIG. 13 is a graph showing a relationship between pressure and deformation of the lid in an eighth example case of the sensor.
Figure 14:
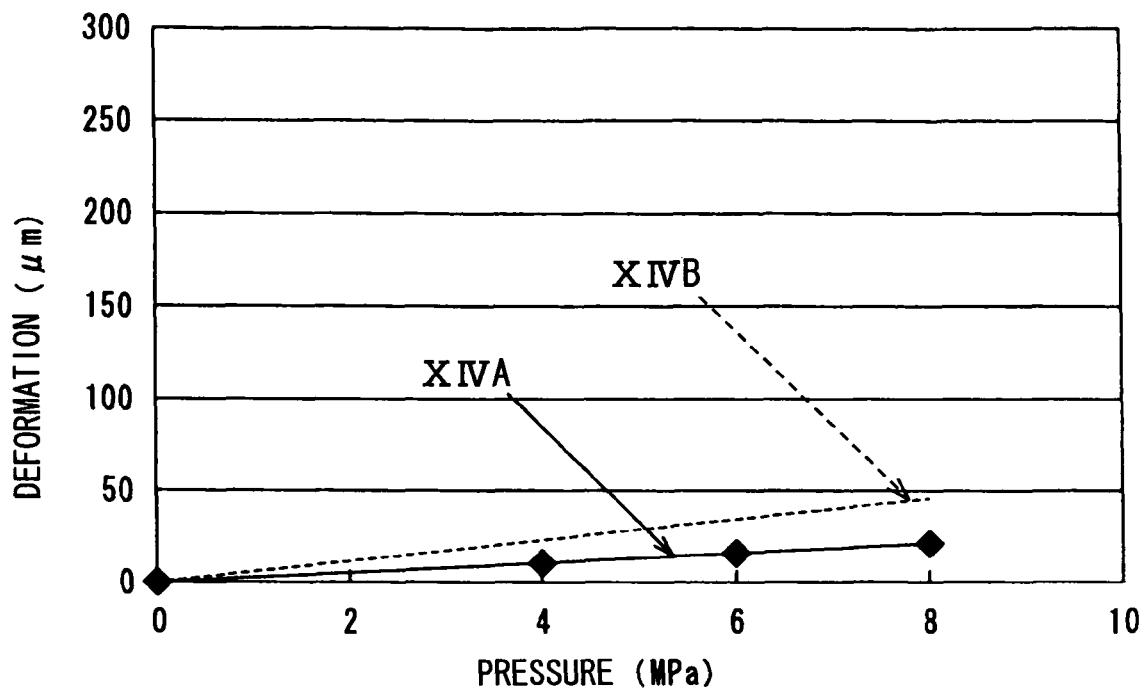
FIG. 14 is a graph showing a relationship between pressure and deformation of the lid in a ninth example case of the sensor.
Figure 15:
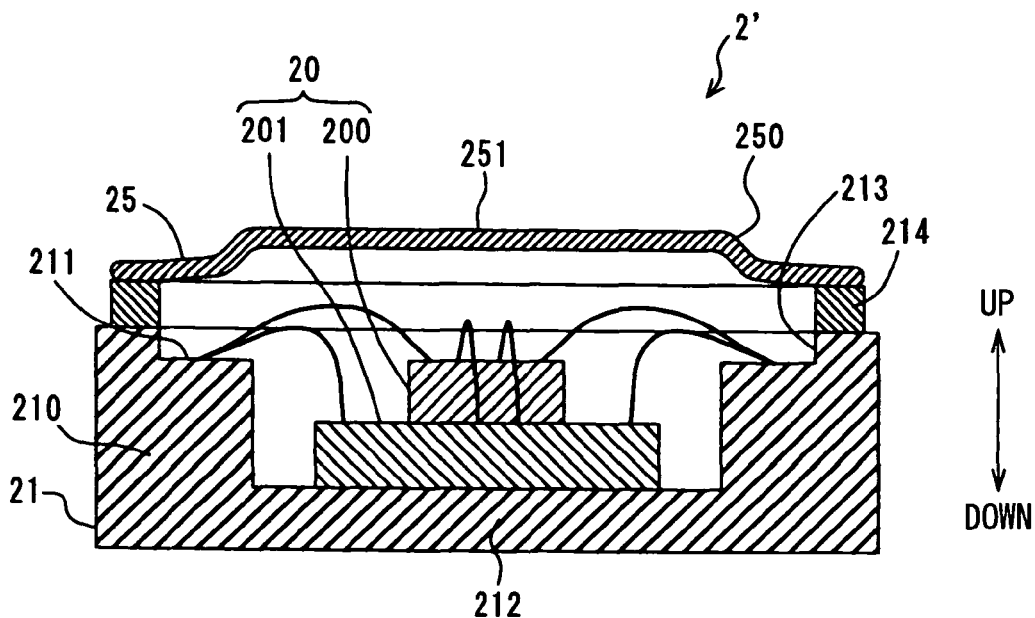
FIG. 15 is a cross sectional view showing a sensing element in an acceleration sensor according to a modification.

FIGS. 12 to 14 shows effects of the lid 24 having the dome shape. FIGS. 12 to 14 are graphs showing analysis results of deformation amount of the lid 24 when external pressure is applied to the lid 24. In FIG. 12, XIIA shows a case where the lid 24 has the dome shape with the thickness of 0.1 mm and the height of the protrusion 240 of 0.1 mm. XIIB shows a case as a comparison where a lid has a plate shape without a dome, and the thickness of the lid is 0.1 mm. In FIG. 13, XIIIA shows a case where the lid 24 has the dome shape with the thickness of 0.1 mm and the height of the protrusion 240 of 0.25 mm. XIIIB shows a case as a comparison where a lid has a plate shape without a dome, and the thickness of the lid is 0.15 mm. In FIG. 14, XIVA shows a case where the lid 24 has the dome shape with the thickness of 0.1 mm and the height of the protrusion 240 of 0.5 mm. XIVB shows a case as a comparison where a lid has a plate shape without a dome, and the thickness of the lid is 0.2 mm.

In a case where the thickness of the lid 24 is 0.1 mm, and the height of the protrusion 240 is 0.1 mm, as shown in FIG. 12, the deformation amount of the lid 24 with respect to the pressure in the curve XIIA is about 60% of that in the curve XIIB. When the thickness t of the lid 24 is 0.1 mm, and the height h of the protrusion 240 is 0.25 mm, as shown in FIG. 13, the deformation amount of the lid 24 in the curve XIVA becomes smaller than that in the curve XIVB, which represents that the thickness is 0.15 mm, and the lid has the plate shape. When the thickness t of the lid 24 is 0.1 mm, and the height h of the protrusion 240 is 0.5 mm, as shown in FIG. 14, the deformation amount of the lid 24 in the curve XIVA becomes smaller than that in the curve XIVB, which represents that the thickness is 0.2 mm, and the lid has the plate shape.

Accordingly, without increasing the thickness of the lid 24, the pressure resistance of the sensing element 2 is improved. Further, short-circuit of the chip 20 is prevented from occurring.

(Modifications)

The shape of a protrusion in the lid 22-24 may be another shape such as an ellipsoid domed shape and a polygonal domed shape.

The shape of a protrusion in the lid 22-24 may be another dome shape. For example, a top portion of the protrusion may be a flat shape so that the protrusion is composed of a partially flat curved dome shape. Further, the protrusion may be a planar domed shape.

Although the semiconductor device 1 is the acceleration sensor, the semiconductor device 1 may be a physical quantity sensor for detecting physical quantity such as pressure, temperature and angular speed.

Although the semiconductor device 1 is the acceleration sensor, the semiconductor device 1 may be a device other than the physical quantity sensor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A physical quantity sensor comprising:
   a case made of resin;
   a connector terminal molded in the case; and
   a sensing element molded in the case, wherein
   the sensing element is electrically coupled with the connector terminal,
   the sensing element includes:
      a semiconductor chip;
      a package for accommodating the chip, wherein the package has a box shape with an opening and a bottom; and
      a cover for sealing the opening of the package,
   the semiconductor chip is disposed on the bottom of the package,
   the cover includes a protrusion, which is disposed at a center of the plate shape, and
   the protrusion protrudes toward an outside of the package; wherein
   the connector terminal and the sensing element are integrally molded in the case; and
   the semiconductor chip is arranged inside the package from a connecting surface between the cover and the package.

2. The sensor according to claim 1, wherein
   the protrusion has a dome shape,
   the protrusion has an outline, which is one of a circular shape, a polygonal shape and an ellipsoid shape, and
   the protrusion has a height, which is equal to or larger than a thickness of the cover.

3. The semiconductor device according to claim 1, wherein
   the protrusion has a dome shape.

4. The semiconductor device according to claim 3, wherein the protrusion has an outline, which is one of a circular shape, a polygonal shape and an ellipsoid shape.

5. The semiconductor device according to claim 1, wherein the protrusion has a height, which is equal to or larger than a thickness of the cover.

6. The semiconductor device according to claim 1, wherein the semiconductor chip detects acceleration.

7. The sensor according to claim 1, wherein the package includes a sidewall that entirely surrounds an outer periphery of the semiconductor chip.

* * * * *